US012341113B2

(12) United States Patent
Huang et al.

(10) Patent No.: US 12,341,113 B2
(45) Date of Patent: Jun. 24, 2025

(54) MANDREL FIN DESIGN FOR DOUBLE SEAL RING

(71) Applicant: Taiwan Semiconductor Manufacturing Company, Ltd., Hsinchu (TW)

(72) Inventors: Shan-Yu Huang, Hsinchu County (TW); Hsueh-Heng Lin, Hsinchu (TW); Shih-Chang Chen, Hsinchu (TW); Hsiao-Wen Chung, Taipei (TW); Yilun Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 453 days.

(21) Appl. No.: 17/738,282

(22) Filed: May 6, 2022

(65) Prior Publication Data

US 2023/0010037 A1   Jan. 12, 2023

Related U.S. Application Data

(60) Provisional application No. 63/219,892, filed on Jul. 9, 2021.

(51) Int. Cl.
  *H01L 23/58*  (2006.01)
  *H01L 23/00*  (2006.01)
(52) U.S. Cl.
  CPC .......... *H01L 23/585* (2013.01); *H01L 23/562* (2013.01)
(58) Field of Classification Search
  None
  See application file for complete search history.

(56) References Cited

U.S. PATENT DOCUMENTS 7,235,864 B2   6/2007  Lee
7,737,501 B2 *  6/2010  Zhu ................. H10B 10/12
                                                    257/E27.098

(Continued)

FOREIGN PATENT DOCUMENTS

CN    102148205 A    8/2011
TW    202013636 A    4/2020

OTHER PUBLICATIONS

Huang et al., "Dummy Patterns in Redundant Region of Double Seal Ring", U.S. Appl. No. 17/336,977, filed Jun. 2, 2021, Assignee: Taiwan Semiconductor Manufacturing Company, Ltd., 24 pages specification, 8 pages drawings.

*Primary Examiner* — Dale E Page
*Assistant Examiner* — Patrick Cullen
(74) *Attorney, Agent, or Firm* — HAYNES AND BOONE, LLP (57) ABSTRACT

A semiconductor structure includes two circuit regions and two inner seal rings, each of which surrounds one of the circuit regions. Each inner seal ring has a substantially rectangular periphery with four interior corner stress relief (CSR) structures. The semiconductor structure further includes an outer seal ring surrounding the two inner seal rings. The outer seal ring has a substantially rectangular periphery without CSR structures at four interior corners of the outer seal ring. The outer seal ring includes a plurality of first fin structures located between each of the two inner seal rings and a respective short side of the outer seal ring. Each first fin structure is parallel with the respective short side of the outer seal ring. Lengths of the first fin structures gradually decrease along a direction from the inner seal rings to the respective short side of the outer seal ring.

20 Claims, 9 Drawing Sheets

(56) References Cited

U.S. PATENT DOCUMENTS

| | | |
|---|---|---|
| 8,022,550 B2 | 9/2011 | Koubuchi et al. |
| 8,253,217 B2 | 8/2012 | Chen et al. |
| 8,334,582 B2 | 12/2012 | Jeng et al. |
| 8,395,239 B2 | 3/2013 | Chen et al. |
| 8,461,021 B2 | 6/2013 | Yaung et al. |
| 8,530,997 B1 | 9/2013 | Yang et al. |
| 8,835,323 B1 | 9/2014 | Shieh et al. |
| 9,093,308 B2 | 7/2015 | Yang et al. |
| 9,245,842 B2 | 1/2016 | Chen et al. |
| 9,437,739 B2 | 9/2016 | Yu et al. |
| 9,443,838 B2 | 9/2016 | Yang et al. |
| 9,946,827 B2 | 4/2018 | Wang et al. |
| 10,229,889 B2 * | 3/2019 | Tatour ............... H01L 21/76892 |
| 10,366,956 B2 | 7/2019 | Yang et al. |
| 10,373,865 B2 | 8/2019 | Yang et al. |
| 10,410,975 B1 * | 9/2019 | Scatchard ............. H01L 23/585 |
| 2011/0284843 A1 | 11/2011 | Chen |
| 2013/0328162 A1 * | 12/2013 | Hu .......................... H10D 8/00 |
| | | 257/E29.174 |
| 2014/0327115 A1 | 11/2014 | Vu et al. |
| 2014/0367835 A1 | 12/2014 | Wei |
| 2015/0255593 A1 * | 9/2015 | Yu .......................... H10D 30/62 |
| | | 257/401 |
| 2015/0340289 A1 * | 11/2015 | Park .................... H10D 30/024 |
| | | 438/700 |
| 2018/0122751 A1 | 5/2018 | Chen et al. |
| 2021/0098455 A1 * | 4/2021 | Yu ...................... H10D 84/0177 |
| 2022/0051993 A1 * | 2/2022 | Chen ..................... H01L 23/562 |
| 2022/0051996 A1 | 2/2022 | Chen |

\* cited by examiner

MANDREL FIN DESIGN FOR DOUBLE SEAL RING

PRIORITY

This application claims the benefits to U.S. Provisional Application Ser. No. 63/219,892 filed Jul. 9, 2021, the entire disclosure of which is incorporated herein by reference.

BACKGROUND

In semiconductor technologies, a semiconductor wafer is processed through various fabrication steps to form integrated circuits (IC). Typically, several circuits or IC dies are formed onto the same semiconductor wafer. The wafer is then diced to cut out the circuits formed thereon. To protect the circuits from moisture degradation, ionic contamination, and dicing processes, a seal ring is formed around each IC die. This seal ring is formed during fabrication of the many layers that comprise the circuits, including both the front-end-of-line (FEOL) processing and back-end-of-line processing (BEOL). The FEOL includes forming transistors, capacitors, diodes, and/or resistors onto the semiconductor substrate. The BEOL includes forming metal layer interconnects and vias that provide routing to the components of the FEOL.

Although existing seal ring structures and fabrication methods have been generally adequate for their intended purposes, improvements are desired. For example, it is desired to form double seal rings depending on chip architecture.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term encompasses numbers that are within certain variations (such as +/−10% or other variations) of the number described, in accordance with the knowledge of the skilled in the art in view of the specific technology disclosed herein, unless otherwise specified. For example, the term "about 5 nm" may encompass the dimension range from 4.5 nm to 5.5 nm, 4.0 nm to 5.0 nm, etc.

This application generally relates to semiconductor structures and fabrication processes, and more particularly to providing a seal ring structure that includes double seal rings (or dual seal rings). The double seal rings include an outer seal ring enclosing two or more inner seal rings. Each inner seal ring surrounds a circuit region (or an IC area or a chip area). Certain regions of the inner seal rings can be selectively opened or closed during manufacturing depending on chip architecture. For example, two circuit regions may be formed to have interconnects (wafer-level interconnects) between them, thereby resulting in connected dies, or they may be formed as separate, individual dies. In the former situation, the inner seal rings surrounding each circuit region are partially opened to allow interconnects to go through. In the latter situation, the inner seal rings surrounding each circuit region are fully closed. In either case, the outer seal ring is fully closed. In the former situation, the wafer is diced (or cut) outside of the outer seal ring, and the outer seal ring provides fully enclosed protection to the connected dies. In the latter situation, the wafer is diced between the inner seal rings, the outer seal ring is also cut, and the inner seal rings provide fully enclosed protection to individual dies.

In an embodiment of the present disclosure, the outer and the inner seal rings both have substantially rectangular periphery (i.e., their exterior outline is rectangular or substantially rectangular). Each inner seal ring further includes four corner stress relief (CSR) structures at the four interior corners of its rectangular periphery. The CSR structures are triangular shaped for improving structural and mechanical stability of the inner seal rings. The outer seal ring does not have CSR structures at the four interior corners of the outer seal ring. Therefore, both the outer and the inner boundary of the outer seal ring are substantially rectangular, which allows the inner seal rings to be placed very close to the outer seal ring. In other words, the inner seal rings and the outer seal ring can be placed abutting each other without empty or redundant regions in between. This advantageously reduces the footprint of the outer seal ring and the total chip area after die-sorting.

The outer seal ring according to the present disclosure includes fin structures that extend lengthwise parallel to the short side of the outer seal ring. The fin structures are disposed along the short sides and the long sides of the inner seal rings. The fin structures disposed along the short side of the inner seal ring and the fin structures disposed along the long side of the same inner seal ring form a substantially right angle into which the exterior corners of the inner seal ring tightly fit. In an embodiment, the fin structures are formed from spacer patterns that are derived from mandrel patterns in a mandrel-spacer double patterning process. The mandrel patterns are formed along with other mandrel patterns in the circuit region and the seal ring regions for improving pattern uniformity. Subsequently, the fin structures are formed by etching a semiconductor substrate using the spacer patterns or derivatives thereof. Thus, the fin structures include a semiconductor material. Still further, the fin structures form a part of a wall structure that extends from the substrate all the way up to a passivation layer. The wall structure may include gate structures, contacts, dielectric layers, and metal layers built over the fin structure and is part of the outer seal ring. By forming these fin structures, better protection to the circuit regions can be achieved. Those of ordinary skill in the art should appreciate that they may readily use the present disclosure as a basis for designing or modifying other processes and structures for carrying out the same purposes and/or achieving the same advantages of the embodiments introduced herein.

Figure 1A:
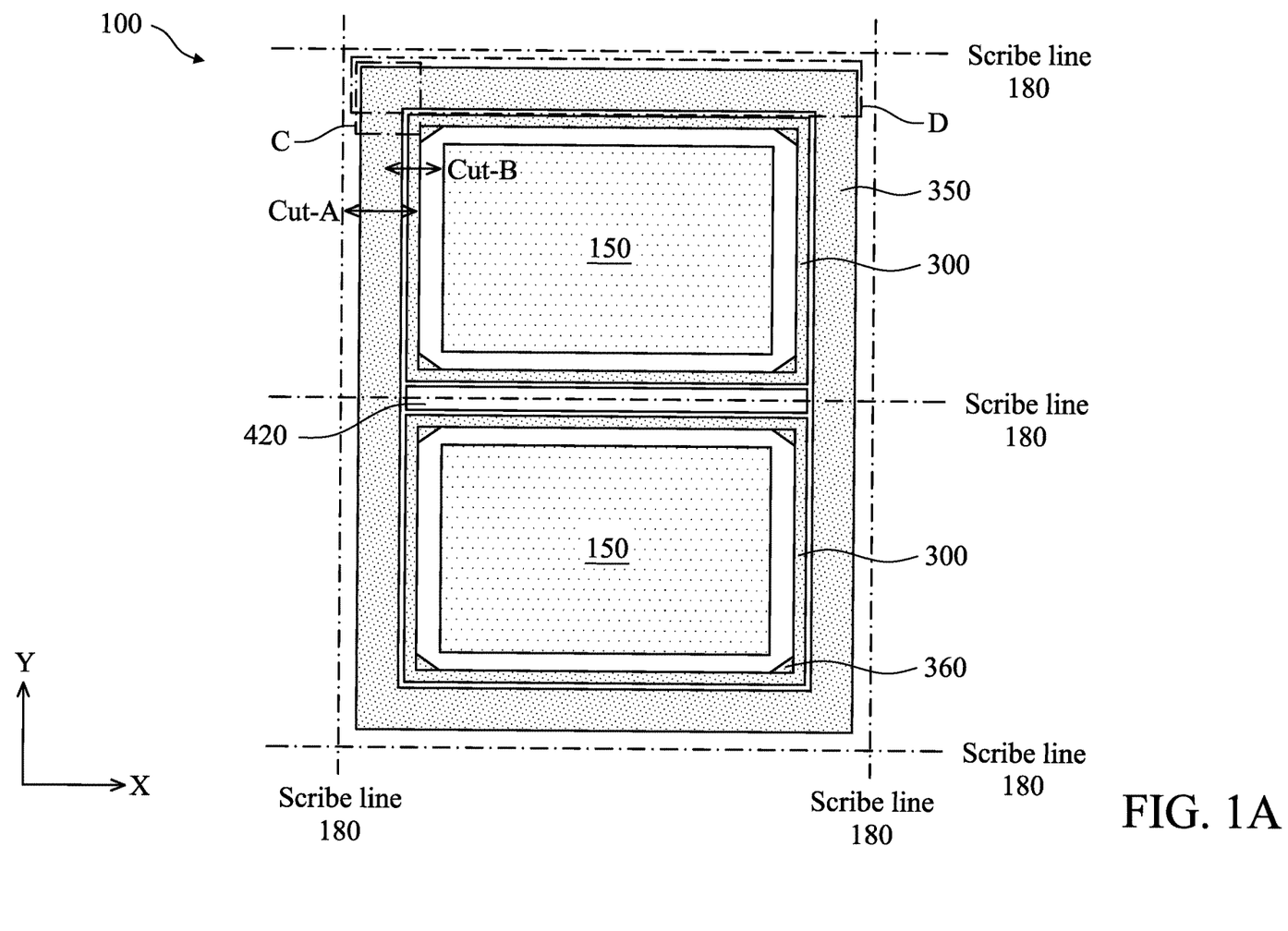
FIG. 1A is a top plan view of a semiconductor structure with multiple circuit regions and multiple seal rings according to aspects of the present disclosure.

FIG. 1A is a top plan view of a semiconductor structure (or semiconductor device) 100 according to the present disclosure. The semiconductor structure 100 (such as a manufactured wafer or a part thereof) includes an outer seal ring 350 that encloses (or surrounds) multiple inner seal rings 300. Each inner seal ring 300 encloses a circuit region (or IC die) 150. The embodiment depicted in FIG. 1A shows two inner seal rings 300 enclosing two circuit regions 150. In other embodiments (not shown), the outer seal ring 350 may enclose more than two inner seal rings 300 each enclosing a circuit region 150. In some embodiments, each circuit region 150 may perform the same function. For example, each circuit region 150 may be a memory chip or a processor chip. In some embodiments, the circuit regions 150 may perform different functions. For example, one circuit region 150 may be a transmitter chip (such as a wireless transmitter) and another circuit region 150 may be a receiver chip (such as a wireless receiver). In the embodiment depicted in FIG. 1A, each circuit region 150 is produced as an individual die or chip. For example, the semiconductor structure 100 is diced (or cut) along scribe lines 180 as illustrated in FIG. 1A. As a result, the outer seal ring 350 is also cut. The inner seal rings 300 stay intact during the dicing process and provide sealing and protective functions to each individual circuit region 150 (also referred to as individual dies 150 for this embodiment).

Figure 1B:
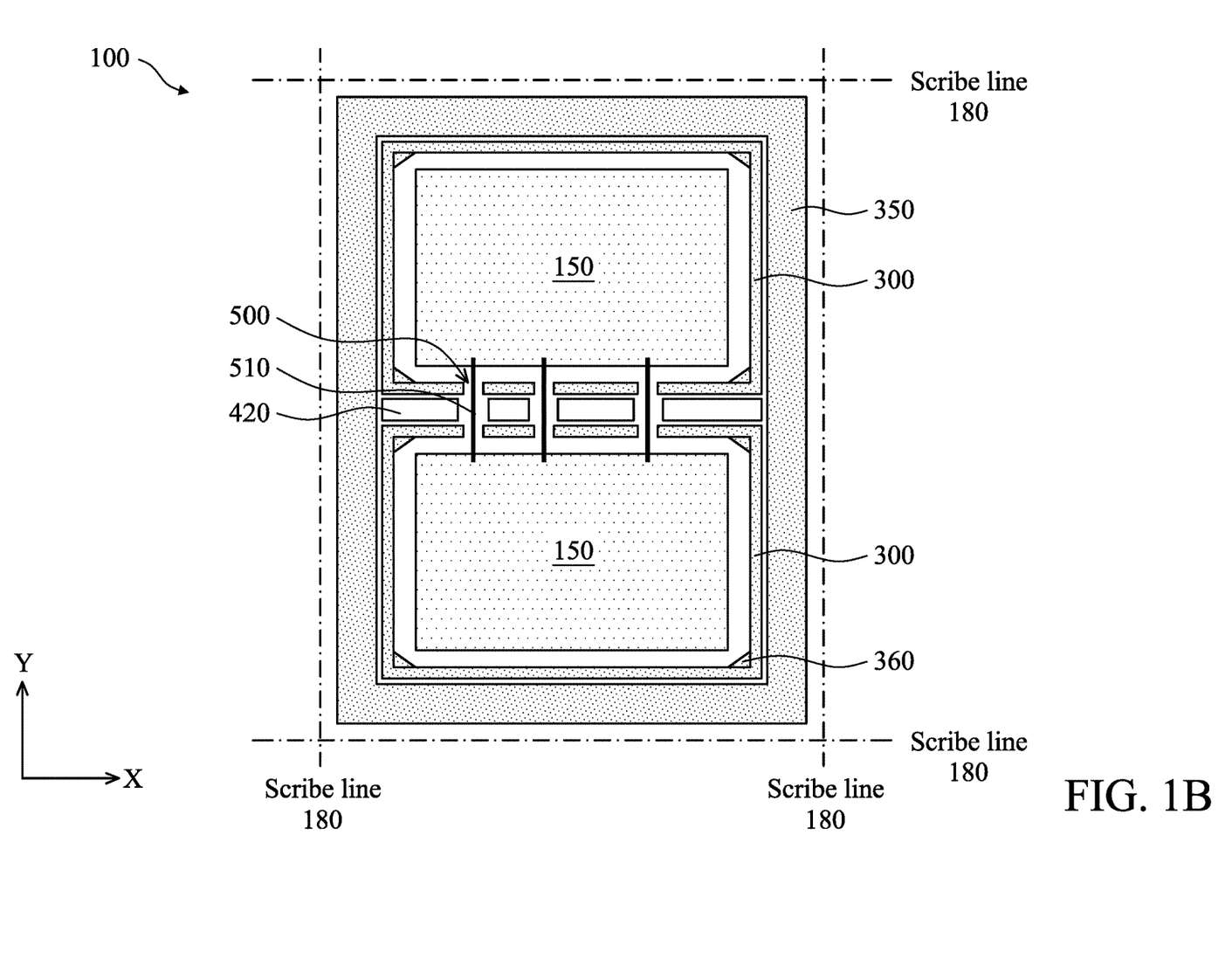
FIG. 1B is a top plan view of a semiconductor structure where inner seal rings are selectively opened, and interconnects are selectively formed between circuit regions according to aspects of the present disclosure.

FIG. 1B is a variant of the embodiment shown in FIG. 1A where inner seal rings 300 are formed with openings 500 at selected locations and interconnects 510 (which are conductors) are formed to connect multiple circuit regions 150 through the openings 500. The interconnects 510 are wafer-level (or die-level) interconnects, which advantageously provide reduced resistance and better noise immunity than some off-chip interconnects. The interconnected circuit regions 150 (also referred to as connected dies 150 for this embodiment) form a larger system (or a system-on-wafer). In such embodiments, the semiconductor structure 100 is diced (or cut) along scribe lines 180 that are outside of the outer seal ring 350 as shown in FIG. 1B. Thus, the outer seal ring 350 provides sealing and protective functions to the connected dies 150.

In an embodiment, the set of masks (referred to as mask set A) that are used to form the semiconductor structure 100 shown in FIG. 1A and the set of masks (referred to as mask set B) that are used to form the semiconductor structure 100 shown in FIG. 1B share some common masks. A mask is also referred to as a photo mask or photomask and is used to perform photolithography on semiconductor wafers to form features of the semiconductor structure 100. For example, mask set A and mask set B may share common masks for some of the diffusion layer, fin layer, gate layer, contact layer, via layers, and metal layers. The fin layer refers to a semiconductor layer where semiconductor fins for FinFETs are formed protruding over a semiconductor substrate (such as a silicon substrate). The mask set A and the mask set B differ in those layers where the interconnects 510 are formed, such as some metal layers, particularly high-level metal layers, such as the fifth metal (M5) layer, the sixth metal (M6) layer, and/or other metal layers. By sharing masks between the mask set A and the mask set B, a manufacturer can selectively produce individual dies 150, connected dies 150, or both, with reduced total costs. For example, if each of the mask set A and the mask set B has N masks, the manufacturer may just need to produce M common masks, $N_1$ masks specifically for the mask set A, and $N_2$ masks specifically for the mask set B, where $M+N_1+N_2$ is less than 2N. The less number of masks produced, the less costs to the manufacturer. The individual dies 150 and the connected dies 150 may satisfy different market demands.

The outer seal rings 350 in the embodiments shown in FIGS. 1A and 1*n* FIG. 1B are the same. The inner seal rings 300 in the embodiments shown in FIGS. 1A and 1*n* FIG. 1B are the same except those openings 500 in FIG. 1B. Thus, for simplicity purposes, the description of the inner seal rings 300 and the outer seal ring 350 below applies to both embodiments, unless it is about the openings 500.

Referring to FIG. 1A, the outer seal ring 350 has a rectangular or substantially rectangular periphery. In other words, the exterior outline (or exterior boundary) of the outer seal ring 350 is rectangular or substantially rectangular. Further, each inner seal ring 300 has a rectangular or substantially rectangular periphery. In other words, the exterior outline (or exterior boundary) of each inner seal ring 300 is rectangular or substantially rectangular. The inner seal ring 300 further includes four corner seal ring (CSR) structures 360 at the four interior corners of the rectangular or substantially rectangular periphery. In an embodiment, the CSR structure 360 is triangular or substantially triangular. For example, the periphery of each CSR structure 360 is a right triangle or a right isosceles triangle. The legs of the triangle run parallel to the edges of the periphery of the inner seal ring 300. The CSR structures 360 provide various mechanical and structural benefits to the inner seal ring 300, such as preventing layer peeling at the corner of the chips during dicing processes. With the CSR structures 360, the interior outline (or interior boundary) of the inner seal ring 300 is octagonal or substantially octagonal. The outer seal ring 350 does not have such CSR structures at its interior corners. Thus, the interior corners of the outer seal ring 350 are 90 degrees or substantially 90 degrees. This allows the exterior corners (which are right-angled) of the inner seal ring 300 to tightly fit into the interior corners (which are also right-angled) of the outer seal ring 350 such that there is no empty space between the outer seal ring 350 and the inner seal rings 300. This way, the total area occupied by the semiconductor structure 100 is reduced, thereby saving manufacturing costs. The region 420 between the inner seal rings 300 may include dummy patterns (not shown) for achieving uniform pattern density.

Figure 2A:
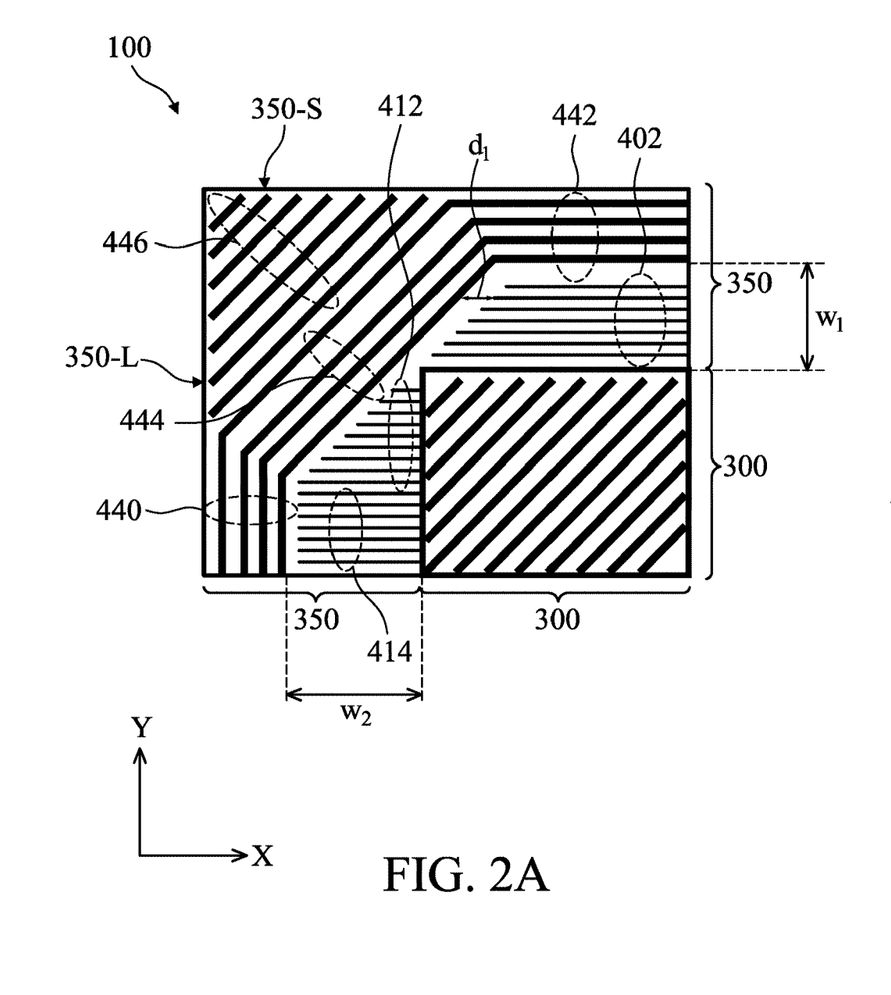
FIG. 2A is a closeup top plan view of the semiconductor structure shown in the area C in FIG. 1A according to an embodiment of the present disclosure.
Figure 2B:
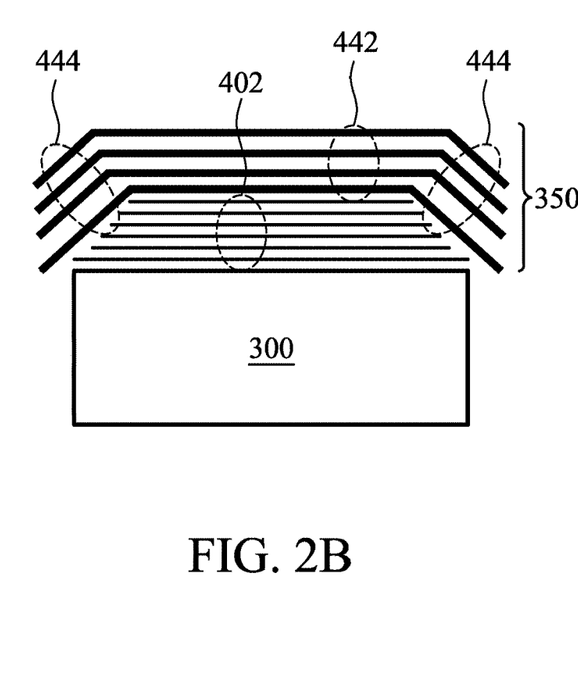
FIG. 2B is a closeup top plan view of the semiconductor structure shown in the area D in FIG. 1A according to an embodiment of the present disclosure.

FIG. 2A shows a closeup top plan view of the semiconductor structure 100 shown in the area C in FIG. 1A according to an embodiment of the present disclosure. FIG. 2B shows a closeup top plan view of the semiconductor structure 100 shown in the area D in FIG. 1A according to an embodiment of the present disclosure. Referring to FIGS. 2A-2B, the outer seal ring 350 includes fin structures 402, 412, 414, 440, 442, 444, and 446. The fin structures 440 are oriented lengthwise parallel to a long side 350-L of the outer seal ring 350. The fin structures 442 are oriented lengthwise parallel to a short side 350-S of the outer seal ring 350. The fin structures 444 diagonally connect the fin structures 440 and 442. As shown in FIG. 2B, the fin structures 442 make up a part of the short side 350-S of the outer seal ring 350. Further, even though not shown in FIGS. 2A-2B, the fin structures 440, 442, and 444 form a continuous ring (such as shown in FIG. 1A) that encloses the inner seal rings 300. The fin structures 446 are oriented lengthwise parallel to the fin structures 444 and are disposed at the exterior corners of the outer seal ring 350. In other words, the fin structures 446 and the inner seal ring 300 are disposed at opposite sides of the fin structures 444. The fin structures 446 are discrete segments, rather than being a ring shape. Further, lengths of the fin structures 446 gradually decrease as they are further away from the fin structures 444. The fin structures 446 collectively form a substantially triangular shape.

The fin structures 402 are oriented lengthwise parallel to the short side 350-S of the outer seal ring 350. Thus, they are also parallel to a short side of the inner seal ring 300. The fin structures 402 are narrower in width than the fin structures 442. In an embodiment, each fin structure 442 is up to 3 times wider than each fin structure 402. The fin structures 402 are discrete segments, rather than being a ring shape. The fin structures 402 are placed close to the fin structures 444. In an embodiment, the fin structures 402 are placed as close to the fin structures 444 as design rules allow. For example, a distance d1 between the fin structures 402 and the fin structures 444 along the "X" direction may be 1 µm or smaller, such as in the range of 0.5 µm to 1 µm, in some embodiments. Further, lengths of the fin structures 402 gradually decrease along the "+Y" direction (i.e., the direction from the short side of the inner seal rings to the short side of the outer seal ring). Thus, the fin structure 402 that is closest to the inner seal ring 300 is the longest, and the fin structure 402 that is furthest from the inner seal ring 300 is the shortest. The fin structures 402 are also referred to as staggered fin structures 402 because their lengths are staggered (one is shorter than another along the "+Y" direction. The fin structures 402 collectively form a trapezoidal shape.

The fin structures 414 and 412 are also oriented lengthwise parallel to the short side 350-S of the outer seal ring 350. They are disposed between the inner seal ring 300 and a long side 350-L of the outer seal ring 350. The fin structures 414 have about equal length among themselves. The lengths of the fin structures 412 gradually decrease along the "+Y" direction. Thus, the fin structure 412 that is closest to the short side 350-S of the outer seal ring 350 is the shortest, and the fin structure 412 that is furthest from short side 350-S of the outer seal ring 350 is the longest. The fin structures 412 collectively form a trapezoidal shape. The fin structures 412 are also referred to as staggered fin structures 412. In an embodiment, the ends of the fin structures 412 and 402 that are proximal the fin structure 444 are substantially along a straight line. Further, the ends of the fin structures 412 that are distal the fin structure 444 are substantially aligned along a straight line in the Y direction. Thus, the fin structures 402, 412, and 414 almost fully fill the space between the inner seal ring 300 and the fin structures 440, 444, and 442, which achieves a good pattern density and improves manufacturing processes such as photolithography and chemical-mechanical polishing (CMP).

Figures 3A, 3B:
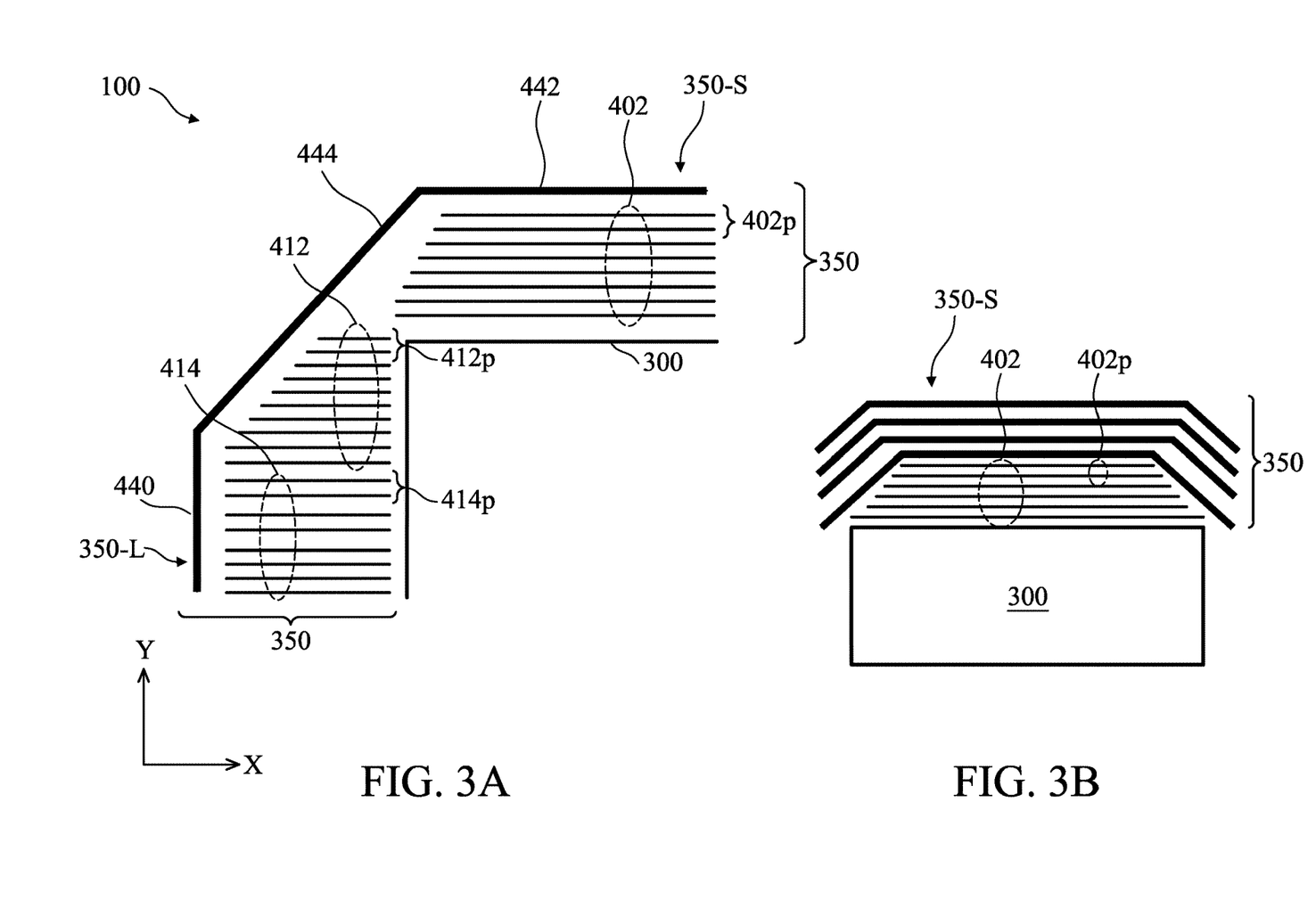
FIG. 3A is a closeup top plan view of a portion of the semiconductor structure shown in the area C in FIG. 1A according to another embodiment of the present disclosure.
FIG. 3B is a closeup top plan view of a portion of the semiconductor structure shown in the area D in FIG. 1A according to another embodiment of the present disclosure.

FIGS. 3A-3B show another embodiment of the semiconductor structure 100. For simplicity purposes, not all components of the semiconductor structure 100 are shown in FIGS. 3A-3B. In this embodiment, the fin structures 402 include pairs 402p of fin structures. Each pair 402p of fin structures have about equal length (i.e., they are considered to have the same length within manufacturing tolerance). Every pair 402p of fin structures are shorter in length than an adjacent pair 402p that are closer to the inner seal ring 300. Similarly, the fin structures 412 include pairs 412p of fin structures. Each pair 412p of fin structures have about equal length (i.e., they are considered to have the same length within manufacturing tolerance). Every pair 412p of fin structures are shorter in length than an adjacent pair 412p that are further away from the short side 350-S of the outer seal ring 350. The fin structures 414 also include pairs 414p of fin structures. But all pairs 414p of fin structures have about equal length. In an embodiment, the fin structures 402, 412, and 414 are formed from spacer patterns (such as spacer patterns 114 in FIGS. 8b-c) on sidewalls of mandrel patterns (such as mandrel pattern 112 in FIGS. 8a-b) in a double patterning process. Each pair 402p, 412p, or 414p correspond to a pair of spacer patterns on the same mandrel pattern. Thus, each pair 402p, 412p, or 414p have about the same length. Further, the mandrel patterns for forming the fin structures 402 are formed to have staggered lengths such as the staggered lengths of the fin structures 402 in FIG. 2A. Thus, the pairs 402p of fin structures are formed to have staggered lengths. Similarly, the mandrel patterns for forming the fin structures 412 are formed to have staggered lengths such as the staggered lengths of the fin structures 412 in FIG. 2A. Thus, the pairs 412p of fin structures are formed to have staggered lengths.

Figure 4:
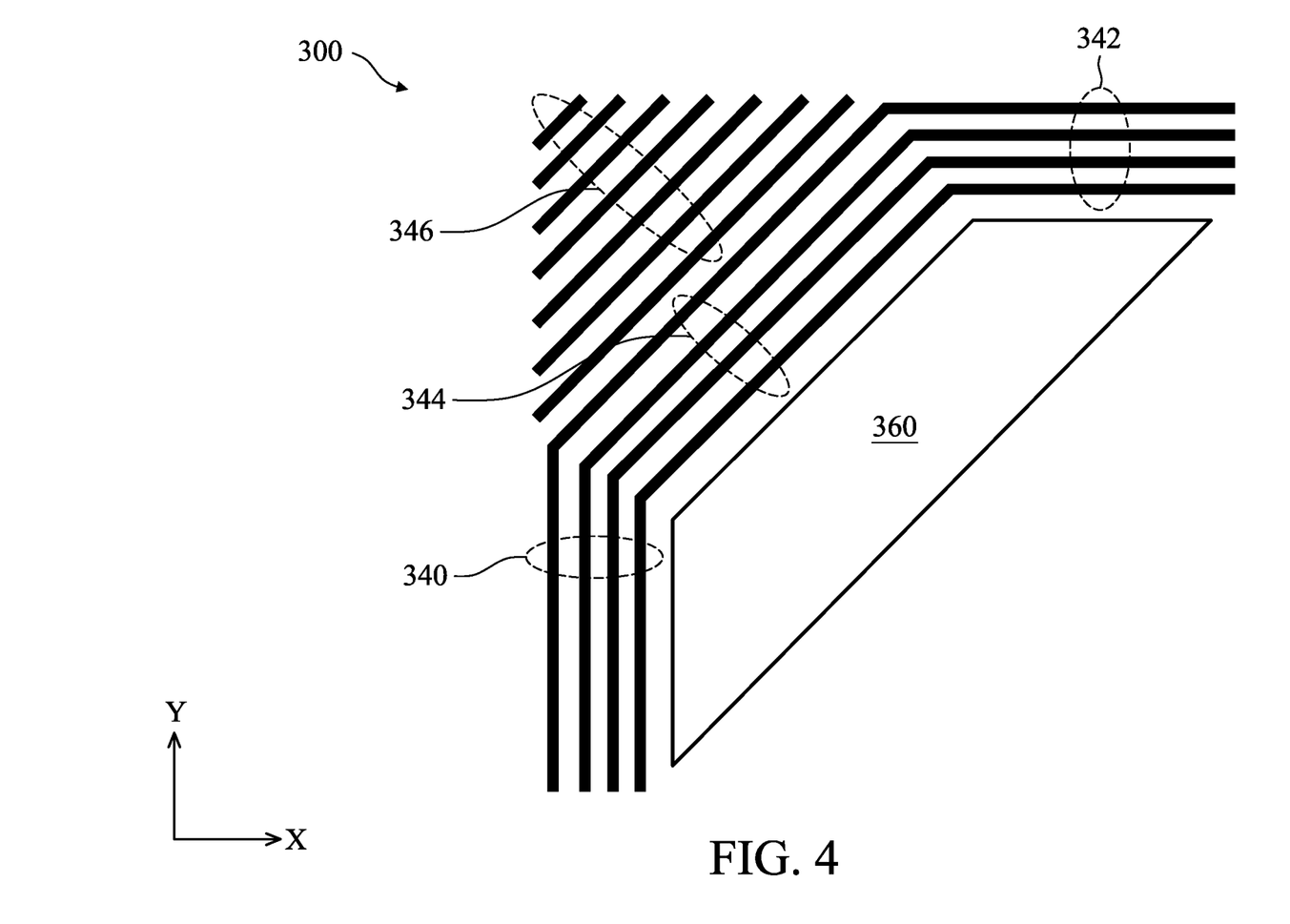
FIG. 4 is a closeup top plan view of a portion of the semiconductor structure shown in the area C in FIG. 1A according to an embodiment of the present disclosure.

FIG. 4 illustrates a part of the inner seal ring 300 in the area C of FIG. 1A. As shown, the inner seal ring 300 includes fin structures 340, 342, 344, 346, and CSR 360. The fin structures 340 are oriented lengthwise parallel to the "Y" direction (i.e., parallel to the long side 350-L of the outer seal ring 350 in FIG. 2A). The fin structures 342 are oriented lengthwise parallel to the "X" direction (i.e., parallel to the short side 350-S of the outer seal ring 350 in FIG. 2A). The fin structures 344 diagonally connect the fin structures 340 and 342. Further, even though not shown, the fin structures 340, 342, and 344 form a continuous ring that encloses the circuit region 150 (see FIG. 1A). The fin structures 346 are oriented lengthwise parallel to the fin structures 344 and are disposed at the exterior corners of the inner seal ring 300. In other words, the fin structures 346 and the CSR 360 are disposed at opposite sides of the fin structures 344. The CSR 360 may include discrete segments, and the overall shape of the CSR 360 is trapezoidal with its short side being proximal the fin structures 344, its long side being distal the fin structures 344, and its legs being parallel to the fin structures 342 and fin structures 340 respectively. The fin structures 346 are discrete segments, rather than being a ring shape. Further, lengths of the fin structures 346 gradually decrease as they are further away from the fin structures 344. The fin structures 346 collectively form a substantially triangular shape, which tightly fits into the right angle formed by the fin structures 402, 414, and 412 (see FIG. 2A).

Figure 5:
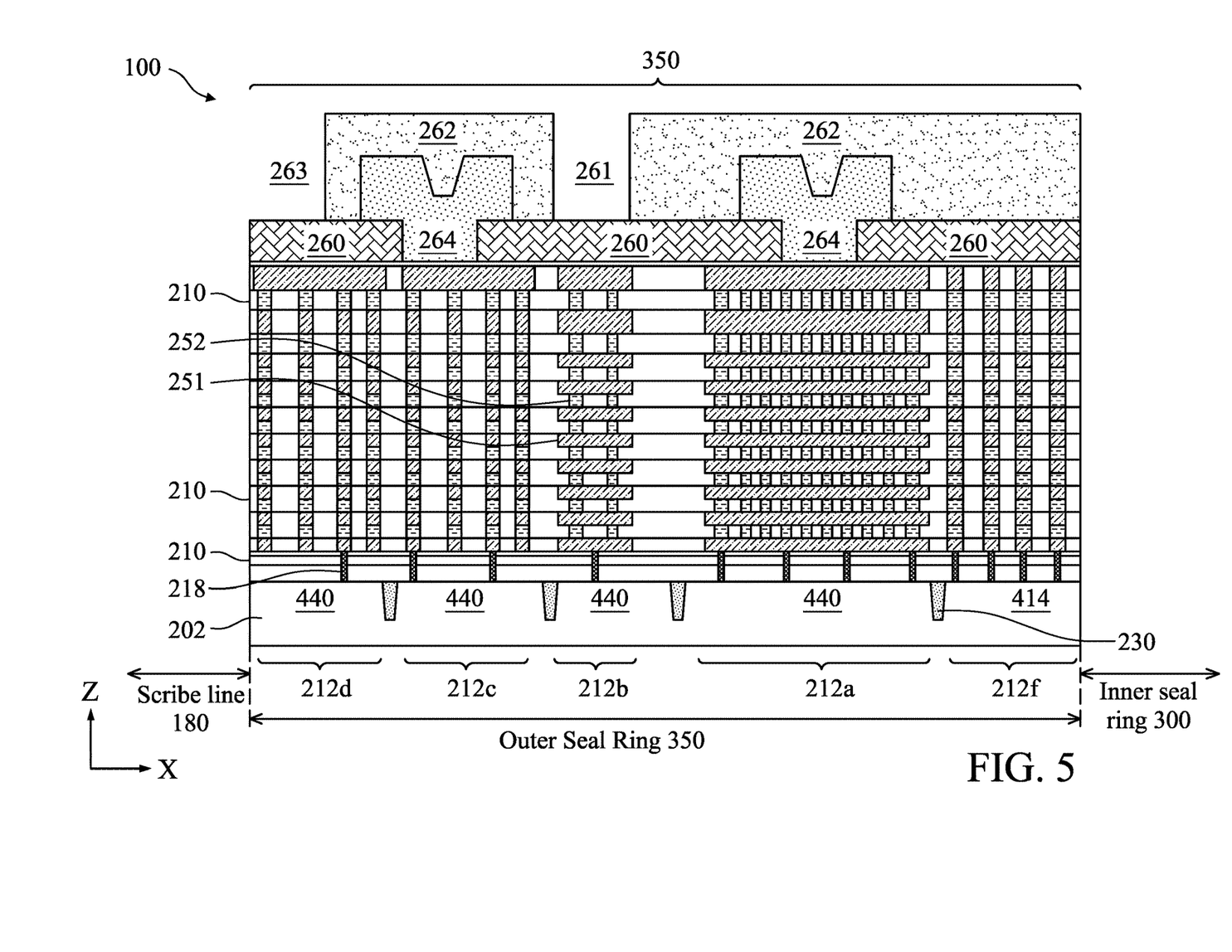
FIG. 5 is a cross-sectional view of a portion of the semiconductor structure shown in FIG. 1A along the "Cut-A" line of FIG. 1A, according to various aspects of the present disclosure.
Figure 6:
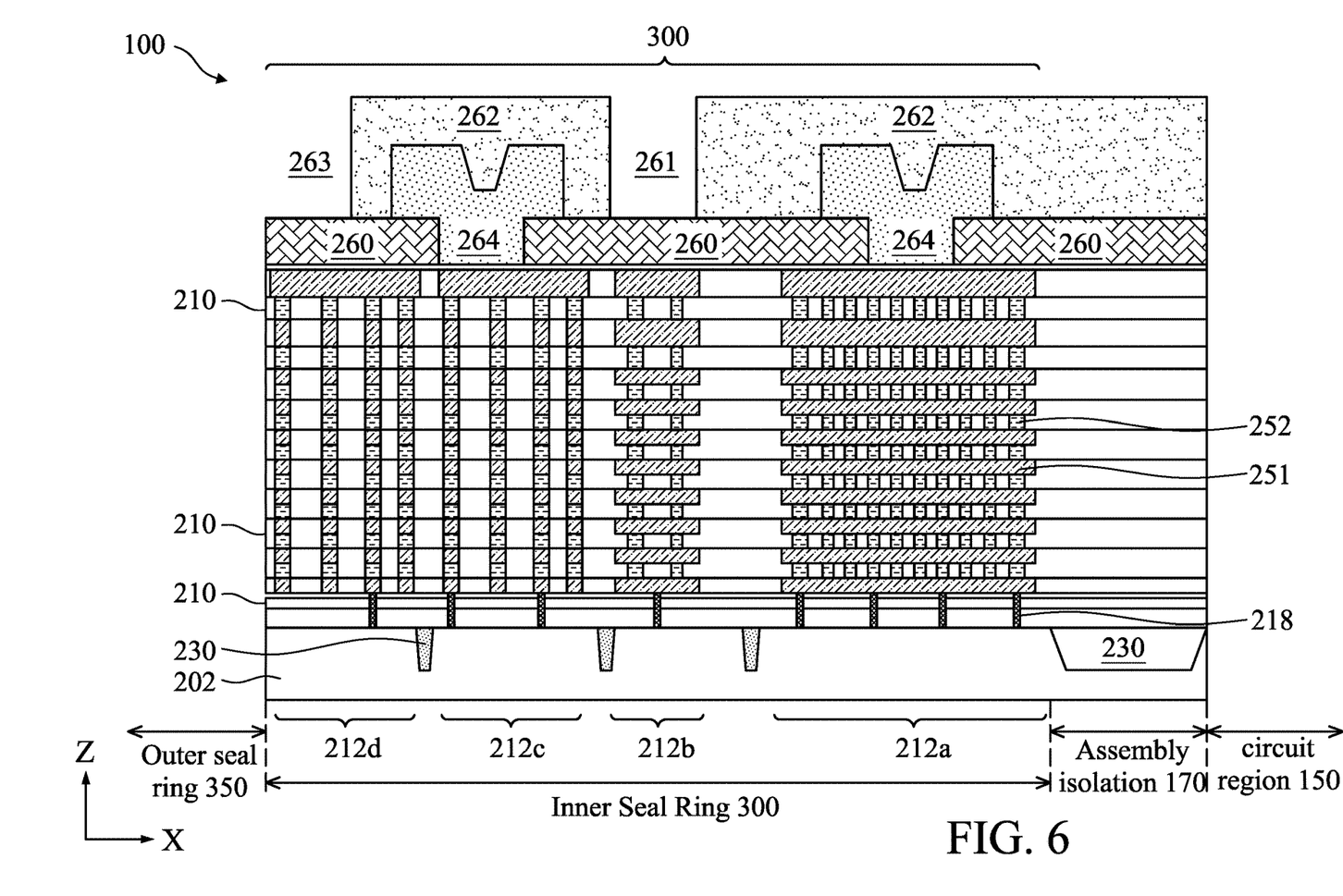
FIG. 6 is a cross-sectional view of a portion of the semiconductor structure shown in FIG. 1A along the "Cut-B" line of FIG. 1A, according to various aspects of the present disclosure.

FIG. 5 illustrates a cross-section of the semiconductor structure 100 along the "Cut-A" line in FIG. 1A according to an embodiment. Effectively, it illustrates a cross-section of the outer seal ring 350 according to an embodiment. FIG. 6 illustrates a cross-section of the semiconductor structure 100 along the "Cut-B" line in FIG. 1A. Effectively, it illustrates a cross-section of the inner seal ring 300 according to an embodiment. Some of the structures of the outer seal ring 350 and the inner seal ring 300 are the same or substantially same. For example, each of the outer seal ring 350 and the inner seal ring 300 includes sub seal rings 212a, 212b, 212c, and 212d.

Referring to FIGS. 5 and 6, the semiconductor structure 100 includes a substrate 202. The substrate 202 is a silicon substrate in the present embodiment. The substrate 202 may alternatively include other semiconductor materials in various embodiment, such as germanium, silicon carbide, gallium arsenide, gallium phosphide, indium phosphide, indium arsenide, indium antimonide, SiGe, GaAsP, AlInAs, AlGaAs, GaInAs, GaInP, GaInAsP, or combinations thereof. The substrate 202 may include doped active regions such as a P-well and/or an N-well 204 (see FIG. 7). The substrate 202 may also further include other features such as a buried layer, and/or an epitaxy layer. Furthermore, the substrate 202 may be a semiconductor on insulator such as silicon on insulator (SOI). In other embodiments, the substrate 202 may include a doped epitaxy layer, a gradient semiconductor layer, and/or may further include a semiconductor layer overlying another semiconductor layer of a different type such as a silicon layer on a silicon germanium layer. The substrate 202 includes active regions (such as N$^+$ or P$^{3+}$ doped regions) that are configured as an NMOS device (e.g., nFET) or a PMOS device (e.g., pFET). The substrate 202 may include underlying layers, devices, junctions, and other features (not shown). The outer seal ring 350, the inner seal rings 300, and the circuit regions 150 are built in or on the substrate 202. The substrate 202 further includes an assembly isolation 170 (see FIG. 6) between the inner seal rings 300 and the circuit regions 150 and scribe line regions (for scribe lines 180) surrounding the outer seal ring 350 and optionally overlapping with the outer seal ring 350.

The outer seal ring 350 includes the sub seal rings 212a, 212b, 212c, 212d, and 212f. The sub seal ring 212a is wider than the other sub seal rings, thus may be referred to as the main sub seal ring. Having multiple nested sub seal rings ensures that at least the inner sub seal ring(s) is/are protected from cracks during dicing (e.g., die sawing). For example, the sub seal rings 212c and 212d can protect the sub seal rings 212a, 212b, and 212f from damages that may occur during dicing.

Each of the sub seal rings 212a, 212b, 212c, 212d, and 212f includes one or more conductive features 218 disposed on the fin structures 440 and 414 that are formed on or in the substrate 202. Although not shown, the one or more conductive features 218 are also disposed on fin structures 402, 412, 442, 444, and 446 that are formed on or in the substrate 202. The fin structures are isolated one from another by an isolation structure 230 such as shallow trench isolation (STI). The conductive features 218 may include multiple conductors vertically stacked, and may include doped semiconductors, metals, conductive nitride, conductive oxide, or other types of conductive materials. Over the conductive features 218, each of the sub seal rings 212a, 212b, 212c, 212d, and 212f further includes multiple metal layers 251 stacked one over another and vertically connected by metal vias 252. Metal layers 251 and metal vias 252 may comprise copper, copper alloys, or other conductive materials and may be formed using damascene or dual damascene processes. Each of the metal layers 251 and the metal vias 252 may include a conductive barrier layer (such as TiN or TaN) surrounding a metal core (such as copper). In an embodiment, each of the metal layers 251 is formed into a ring or a ring-like structure (such as a substantially square ring) that surrounds the inner seal rings 300 and the circuit regions 150. In other words, each of the metal layers 251 is formed into a closed structure and extends along the edges of the area occupied by the inner seal rings 300 and the circuit regions 150. In the present embodiment, a ring or a ring-like structure refers to a closed structure, which may be rectangular, square, substantially rectangular, substantially square, or in other polygonal shapes. In an embodiment, the outer vias 252 (the vias 252 that are the closest and the furthest, respectively, from the inner seal rings 300 and the circuit regions 150) are formed into the shape of a ring. Thus, they are also referred to as via bars. The inner vias 252 are formed into discrete vias that form a line parallel to the outer vias 252. In the present embodiment, each of the sub seal rings 212a and 212c further includes an aluminum pad 264.

The conductive features 218, the metal layers 251, and the metal vias 252 are embedded in dielectric layers 210. The dielectric layers 210 may include silicon oxide, silicon nitride, silicon oxynitride, low-k dielectric materials, extreme low-k (ELK) dielectric materials, or other suitable dielectric materials (for example, including silicon, oxygen, nitrogen, carbon, or other suitable isolation constituent), or combinations thereof. The semiconductor structure 100 further includes a passivation layer 260 over the dielectric layers 210 and another passivation layer 262 over the passivation layer 260. Each of the aluminum pads 264 includes a top portion that is disposed over the passivation layer 260 and a bottom portion that penetrates the passivation layer 260 and electrically connects to the sub seal rings 212a and 212c. In an embodiment, each of the aluminum pads 264 is formed into a shape of a ring that surrounds the inner seal rings 300 and the circuit regions 150. Thus, the aluminum pads 264 may also be referred to as aluminum rings 264. Aluminum pads 264 may be formed simultaneously with the formation of bond pads (not shown) that are exposed on the top surface of circuit regions 150. The passivation layer 262 is disposed over the passivation layer 260 and the aluminum pads 264. Passivation layers 260 and 262 may be formed of oxides, nitrides, and combinations thereof, and may be formed of the same or different materials. Each of the sub seal rings 212a-f is in the form a vertical wall extending from the substrate 202 (particularly, from the fin structures 402, 412, 414, 440, 442, 444, and 446) to the upper metal layer 251 and the aluminum pad 264.

A trench 261 is provided in the passivation layer 262 above the sub seal ring 212b. Another trench 263 is provided in the passivation layer 262 above the sub seal ring 212d. In an embodiment, each of the trenches 261 and 263 is formed into a shape of a ring surrounding the inner seal rings 300 and the circuit regions 150. An advantageous feature of the dual trenches 261, 263 is that if a crack occurs in the scribe line during dicing, the crack will be stopped by the trench 263. Even if the crack propagates across the trench 263, if at all, the stress of the crack is substantially reduced by the trench 261. The semiconductor structure 100 may include other features and layers not shown in FIG. 5.

FIG. 6 shows a cross-sectional view of a portion of the semiconductor structure 100 along the "Cut-B" line of FIG. 1A, according to various aspects of the present disclosure. Referring to FIG. 6, similar to the outer seal ring 350, the inner seal ring 300 also includes multiple sub seal rings such as sub seal rings 212a, 212b, 212c, and 212d. The features of the inner seal ring 300 are the same as those of the outer seal ring 350, other than that, for example, the dimensions of the sub seal rings may be different between them.

The semiconductor structure 100 further includes an assembly isolation 170 between the inner seal ring 300 and the circuit region 150. The assembly isolation 170 includes the isolation structure (such as shallow trench isolation) 230. The isolation structure 230 may include silicon oxide, silicon nitride, silicon oxynitride, other suitable isolation material (for example, including silicon, oxygen, nitrogen, carbon, or other suitable isolation constituent), or combinations thereof. Isolation structure 230 can include different structures, such as shallow trench isolation (STI) structures and/or deep trench isolation (DTI) structures. In some embodiments, the semiconductor structure 100 may include various dummy lines and dummy vias in the assembly isolation 170.

Figure 7:
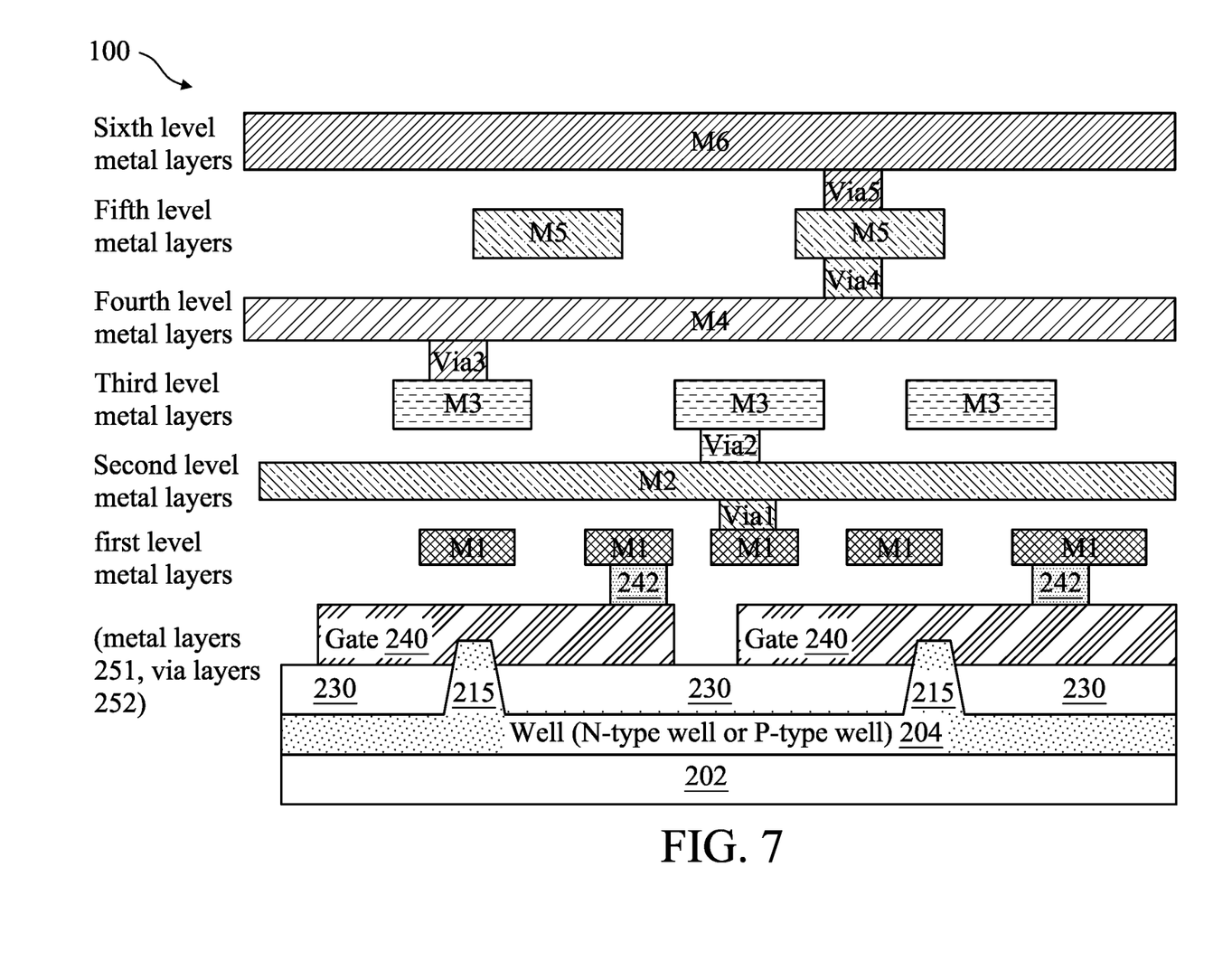
FIG. 7 shows a cross-sectional view of various layers of the semiconductor structure shown in FIGS. 1A-1B, according to an embodiment of the present disclosure.

FIG. 7 shows a cross-sectional view of the semiconductor structure 100, illustrating various layers therein including wells (or diffusion layer) 204, isolation structure 230, fin layer 215 (including fin structures 402, 412, 414, 440, 444, 442, 446, 340, 342, 344, and 346), gate layer 240, gate via layer 242, contact layer (not shown, but at the same level as the gate layer 240), contact via (or via0) layer (not shown, but at the same level as the gate via layer 242), the first through sixth metal (M1, M2, M3, M4, M5, and M6) layers 251, and the first through fifth via (via1, via2, via3, via4, and via5) layers 252. The semiconductor structure 100 may include other layers or features not shown in FIG. 7, such as doped source/drain semiconductor layers. The conductive features 218 may include doped source/drain semiconductor layers, gate layer 240, gate via layer 242, contact layer, contact via, or a combination thereof.

In an embodiment, the wells 204 are formed in or on the substrate 202 in the circuit regions 150. The wells 204 include p-type doped regions configured for n-type transistors, and n-type doped regions configured for p-type transistors. The fin layer 215 includes fin-shaped semiconductor material(s) (or fins or fin structures) protruding from the substrate 202. In an embodiment, the fin layer 215 may include silicon, germanium, silicon germanium, or another suitable semiconductor material.

The gate layer 240 includes gate structures having gate dielectric layer(s) and gate electrode layer(s). The gate dielectric layer(s) may include silicon dioxide, silicon oxynitride, and/or a high-k dielectric material such as $HfO_2$, HfSiO, $HfSiO_4$, HfSiON, HfLaO, HfTaO, HfTiO, HfZrO, $HfAlO_x$, ZrO, $ZrO_2$, $ZrSiO_2$, AlO, AlSiO, $Al_2O_3$, TiO, $TiO_2$, LaO, LaSiO, $Ta_2O_3$, $Ta_2O_5$, $Y_2O_3$, $SrTiO_3$, BaZrO, $BaTiO_3$ (BTO), $(Ba,Sr)TiO_3$ (BST), $Si_3N_4$, hafnium dioxide-alumina ($HfO_2$—$Al_2O_3$) alloy, other suitable high-k dielectric material, or combinations thereof. High-k dielectric material generally refers to dielectric materials having a high dielectric constant, for example, greater than that of silicon oxide (k≈3.9). The gate electrode layer(s) may include titanium, aluminum, tantalum carbide, tantalum carbide nitride, tantalum silicon nitride, titanium nitride, tantalum nitride, ruthenium, molybdenum, tungsten, platinum, tungsten, cobalt, copper, and/or other suitable materials.

Each of the gate via layer 242, contact layer (not shown), contact via layer (not shown), the via layers 252, and the metal layers 251 may include titanium, tantalum, tungsten, cobalt, molybdenum, ruthenium, or a conductive nitride such as titanium nitride, titanium aluminum nitride, tungsten nitride, tantalum nitride, or combinations thereof, and may be formed by CVD, PVD, ALD, and/or other suitable processes.

Figure 8A:
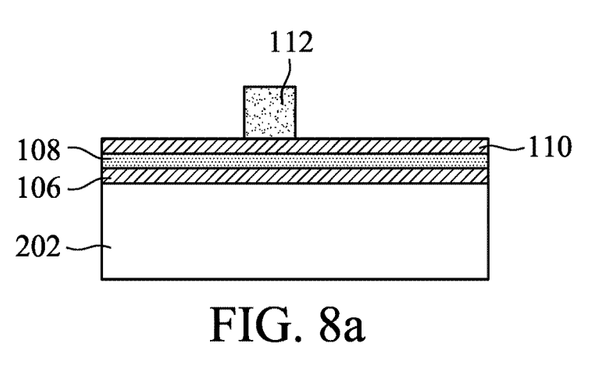
FIGS. 8a, 8b, 8c, and 8d illustrate a process for forming fin structures in the semiconductor structure, according to various aspects of the present disclosure.
Figure 8B:
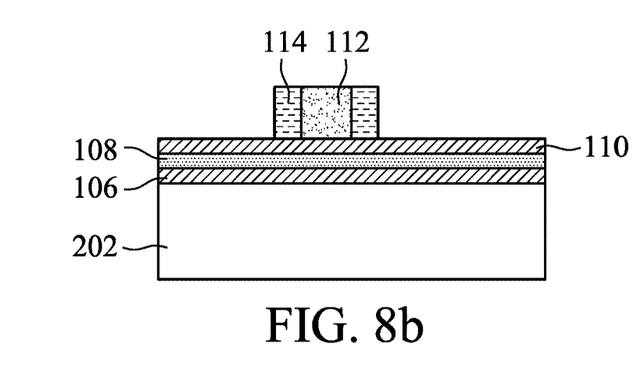
Figure 8C:
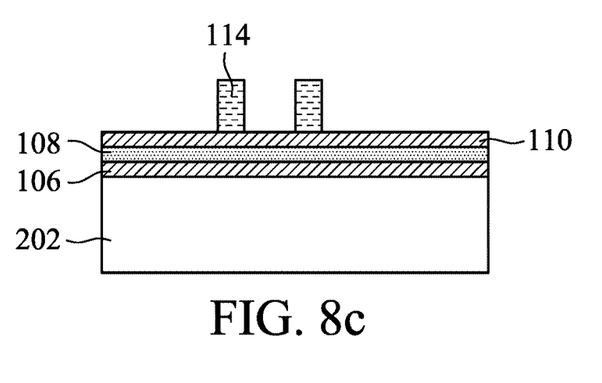
Figure 8D:
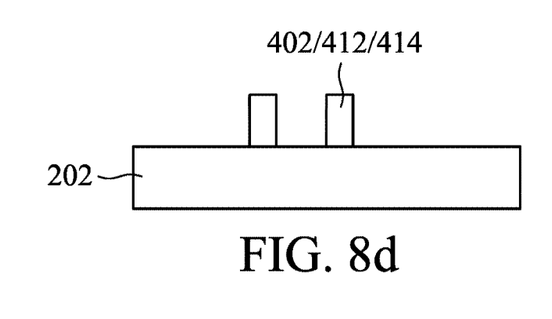

FIGS. 8a-8d illustrate a process for forming the fin structures 402, 412, 414, and other fin structures using mandrel-spacer double patterning. Referring to FIG. 8a, hard mask layers 106, 108, and 110 are formed over the substrate 202, and a mandrel pattern 112 is formed over the hard mask layer 110. The hard mask layers 106, 108, and 110 may include any suitable materials, including titanium nitride, silicon oxide, and silicon oxycarbide. The mandrel pattern 112 may include an anti-reflective polymeric material. The mandrel pattern 112 may be formed using photolithography and etching processes and may be formed into the shape of the fin structures 402, 412, 414, and other fin structures such as those described with reference to FIGS. 2A-2B. In an embodiment (not shown), the hard mask layer 106, 108, and 110 are etched using the mandrel pattern 112 as an etch mask to form a hard mask pattern, then the substrate 202 is etched using the hard mask pattern as an etch mask, thereby forming the fin structures 402, 412, and 414 in the substrate 202. In the present embodiment, spacer patterns 114 are formed on sidewalls of the mandrel pattern 112, such as shown in FIG. 8b. Subsequently, mandrel pattern 112 is removed, leaving the spacer pattern 114 on the hard mask layers 110, such as shown in FIG. 8c. The spacer pattern 114 may be subsequently trimmed. In an embodiment, the spacer pattern 114 has a shape corresponding to the fin structures 402, 412, and 414 as described with reference to FIGS. 3A-3B. Subsequently, the shape of the spacer pattern 114 is transferred to the substrate 202 using etching processes, thereby forming the fin structures 402, 412, and 414 in or on the substrate 202, such as shown in FIG. 8d.

Although not intended to be limiting, embodiments of the present disclosure provide one or more of the following advantages. For example, embodiments of the present disclosure provide a semiconductor structure with a double seal ring structure. The double seal ring structure includes an outer seal ring enclosing two or more inner seal rings. Each inner seal ring encloses a circuit region. The semiconductor structure can be used to form connected dies or individual dies. The outer seal ring provides the sealing and protective function to the connected dies. The inner seal rings provide the sealing and protective function to the individual dies. The inner seal rings closely fit into the outer seal ring without redundant regions therebetween, thereby reducing the footprint of the semiconductor structure. Further, in some embodiments, multiple (such as four) sub seal rings are formed in the outer seal ring and the inner seal rings to further improve the seal rings' operational reliability. Embodiments of the present disclosure can be readily integrated into existing semiconductor manufacturing processes.

In one example aspect, the present disclosure is directed to a semiconductor structure that includes two circuit regions and two inner seal rings. Each of the two inner seal rings surrounds a respective one of the two circuit regions. Each of the inner seal rings has a substantially rectangular periphery with four interior corner stress relief (CSR) structures at four corners of the respective inner sing ring. The semiconductor structure further includes an outer seal ring surrounding the two inner seal rings, wherein the outer seal ring has a substantially rectangular periphery without CSR structures at four interior corners of the outer seal ring. The outer seal ring includes a plurality of first fin structures located between each of the two inner seal rings and a respective short side of the outer seal ring. Each of the plurality of first fin structures is parallel with the respective short side of the outer seal ring. Lengths of the plurality of first fin structures gradually decrease along a direction from the inner seal rings to the respective short side of the outer seal ring.

In an embodiment of the semiconductor structure, the plurality of first fin structures includes pairs of first fin structures, wherein each pair of first fin structures have substantially equal length, and every pair of first fin structures is shorter in length than an adjacent pair of first fin structures that are closer to the inner seal ring.

In an embodiment, the outer seal ring further includes a plurality of second fin structures located between the two inner seal rings and a long side of the outer seal ring, wherein each of the plurality of second fin structures is parallel with a short side of the outer seal ring, and among the plurality of second fin structures, the one that is closest to the short side of the outer seal ring is the shortest. In a further embodiment, the plurality of second fin structures includes pairs of second fin structures, wherein each pair of second fin structures have substantially equal length, and every pair of second fin structures is shorter in length than an adjacent pair of second fin structures that are further away from the short side of the outer seal ring.

In another embodiment, the outer seal ring further includes a plurality of third fin structures forming a long side of the outer seal ring, a plurality of fourth fin structures forming the short side of the outer seal ring, and a plurality of fifth fin structures diagonally connecting the plurality of third fin structures with the plurality of fourth fin structures. In a further embodiment, the outer seal ring further includes a plurality of sixth fin structures parallel to the plurality of fifth fin structures, wherein the plurality of sixth fin structures and the inner seal ring are disposed on opposite sides of the plurality of fifth fin structures. In another further embodiment, a distance from the plurality of first fin structures to the plurality of fifth fin structures along a direction parallel to the short side of the outer seal ring is less than 1 µm.

In an embodiment of the semiconductor structure, each of the inner seal rings includes a plurality of seventh fin structures forming a long side of the respective inner seal ring, a plurality of eighth fin structures forming the short side of the respective inner seal ring, and a plurality of ninth fin structures diagonally connecting the plurality of seventh fin structures with the plurality of eighth fin structures. In a further embodiment, each of the inner seal ring further includes a plurality of tenth fin structures parallel to the plurality of ninth fin structures, wherein the plurality of tenth fin structures are disposed between the plurality of ninth fin structures and the outer seal ring. In another further embodiment, the plurality of tenth fin structures and one of the CSR structures are disposed on opposite sides of the plurality of ninth fin structures.

In another example aspect, the present disclosure is directed to a semiconductor structure. The semiconductor structure includes two circuit regions; two first seal rings, each of the two first seal rings having a substantially rectangular periphery and surrounding a respective one of the two circuit regions; and a second seal ring surrounding the two first seal rings, the second seal ring having a substantially rectangular periphery and having four substantially right-angled interior corners. The second seal ring includes a plurality of first fin structures located between each of the two first seal rings and a respective short side of the second seal ring and a plurality of second fin structures located between each of the two first seal rings and a long side of the second seal ring. Each of the plurality of first fin structures and each of the plurality of second fin structures are parallel with the short sides of the second seal ring. Among the plurality of first fin structures, the one that is closest to the respective short side of the second seal ring is the shortest or one of the shortest, and among the plurality of second fin structures, the one that is closest to the respective short side of the second seal ring is the shortest or one of the shortest.

In an embodiment of the semiconductor structure, the plurality of first fin structures and the plurality of second fin structures are formed from spacer patterns on sidewalls of mandrel patterns in a double patterning process.

In another embodiment, the plurality of first fin structures includes pairs of first fin structures, wherein each pair of first fin structures have about equal length, and every pair of first fin structures is shorter in length than an adjacent pair of first fin structures that are further away from the respective short side of the second seal ring. In a further embodiment, the plurality of second fin structures includes pairs of second fin structures, wherein each pair of second fin structures have about equal length, and every pair of second fin structures is shorter in length than an adjacent pair of second fin structures that are further away from the respective short side of the second seal ring.

In an embodiment, the plurality of first fin structures and the plurality of second fin structures include a semiconductor material. In another embodiment, each of the plurality of first fin structures and the plurality of second fin structures is at a bottom of a vertical structure that extends from a semiconductor substrate to a top metal layer covered by a passivation layer.

In yet another example aspect, the present disclosure is directed to a semiconductor structure that includes two circuit regions and two first seal rings, each of the two first seal rings surrounding a respective one of the two circuit regions. The semiconductor structure further includes a second seal ring enclosing the two first seal rings. The second seal ring has a substantially rectangular periphery with two short sides and two long sides. The second seal ring includes multiple pairs of first fin structures located between each of the two first seal rings and a respective short side of the second seal ring and multiple pairs of second fin structures located between each of the two first seal rings and a respective long side of the second seal ring. Each of the first fin structures and each of the second fin structures are parallel with the short sides of the second seal ring. Each pair of first fin structures have about equal length, and every pair of first fin structures is shorter in length than an adjacent pair of first fin structures that are further away from the respective short side of the second seal ring. Each pair of second fin structures have about equal length, and every pair of second fin structures is shorter in length than an adjacent pair of second fin structures that are further away from the respective short side of the second seal ring.

In an embodiment, the second seal ring further includes third fin structures located between each of the two first seal rings and the respective long side of the second seal ring, wherein the third fin structures are lengthwise parallel to the second fin structure, have about equal length among the third fin structures, and are substantially evenly distributed along the respective long side of the second seal ring.

In another embodiment, the first fin structures and the second fin structures are formed by etching a semiconductor substrate using spacer patterns formed on sidewalls of mandrel patterns in a double patterning process. In yet another embodiment, the multiple pairs of first fin structures are substantially evenly distributed in a space that is about 5 µm to 8 µm wide.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    two circuit regions;
    two inner seal rings, each of the two inner seal rings surrounding a respective one of the two circuit regions, wherein each of the inner seal rings has a substantially rectangular periphery with four interior corner stress relief (CSR) structures at four corners of the respective inner seal ring; and
    an outer seal ring surrounding the two inner seal rings, wherein the outer seal ring has a substantially rectangular periphery without the CSR structures at four interior corners of the outer seal ring,
    wherein the outer seal ring includes a plurality of first dummy fin structures located between each of the two inner seal rings and a respective short side of the outer seal ring,
    wherein each of the plurality of first dummy fin structures is parallel with the respective short side of the outer seal ring, and
    wherein lengths of the plurality of first dummy fin structures gradually decrease along a direction from the inner seal rings to the respective short side of the outer seal ring.

2. The semiconductor structure of claim 1, wherein the plurality of first dummy fin structures include pairs of first dummy fin structures, wherein each pair of first dummy fin structures have substantially equal length, and every pair of first dummy fin structures is shorter in length than an adjacent pair of first dummy fin structures that are closer to the inner seal ring.

3. The semiconductor structure of claim 1, wherein the outer seal ring further includes:
    a plurality of second dummy fin structures located between the two inner seal rings and a long side of the outer seal ring,
    wherein each of the plurality of second dummy fin structures is parallel with a short side of the outer seal ring, and
    wherein among the plurality of second dummy fin structures, the one that is closest to the short side of the outer seal ring is the shortest.

4. The semiconductor structure of claim 3, wherein the plurality of second dummy fin structures include pairs of second dummy fin structures, wherein each pair of second dummy fin structures have substantially equal length, and every pair of second dummy fin structures is shorter in length than an adjacent pair of second dummy fin structures that are further away from the short side of the outer seal ring.

5. The semiconductor structure of claim 3, wherein the outer seal ring further includes:
    a plurality of third dummy fin structures forming a long side of the outer seal ring;
    a plurality of fourth dummy fin structures forming the short side of the outer seal ring; and
    a plurality of fifth dummy fin structures diagonally connecting the plurality of third dummy fin structures with the plurality of fourth dummy fin structures.

6. The semiconductor structure of claim 5, wherein the outer seal ring further includes:
    a plurality of sixth dummy fin structures parallel to the plurality of fifth dummy fin structures, wherein the plurality of sixth dummy fin structures and the inner seal ring are disposed on opposite sides of the plurality of fifth dummy fin structures.

7. The semiconductor structure of claim 5, wherein a distance from the plurality of first dummy fin structures to the plurality of fifth dummy fin structures along a direction parallel to the short side of the outer seal ring is less than 1 µm.

8. The semiconductor structure of claim 6, wherein each of the inner seal rings includes:
    a plurality of seventh dummy fin structures forming a long side of the respective inner seal ring;
    a plurality of eighth dummy fin structures forming the short side of the respective inner seal ring; and
    a plurality of ninth dummy fin structures diagonally connecting the plurality of seventh dummy fin structures with the plurality of eighth dummy fin structures.

9. The semiconductor structure of claim 8, wherein each of the inner seal ring further includes:
    a plurality of tenth dummy fin structures parallel to the plurality of ninth dummy fin structures, wherein the plurality of tenth dummy fin structures are disposed between the plurality of ninth dummy fin structures and the outer seal ring.

10. The semiconductor structure of claim 9, wherein the plurality of tenth dummy fin structures and one of the CSR structures are disposed on opposite sides of the plurality of ninth dummy fin structures.

11. A semiconductor structure, comprising:
    two circuit regions;
    two first seal rings, each of the two first seal rings having a substantially rectangular periphery and surrounding a respective one of the two circuit regions; and a second seal ring surrounding the two first seal rings, the second seal ring having a substantially rectangular periphery and having four substantially right-angled interior corners, wherein the second seal ring includes a plurality of first dummy fin structures located between each of the two first seal rings and a respective short side of the second seal ring and a plurality of second dummy fin structures located between each of the two first seal rings and a long side of the second seal ring, wherein each of the plurality of first dummy fin structures and each of the plurality of second dummy fin structures are parallel with the short sides of the second seal ring, and wherein among the plurality of first dummy fin structures, the one that is closest to the respective short side of the second seal ring is the shortest or one of the shortest, and among the plurality of second dummy fin structures, the one that is closest to the respective short side of the second seal ring is the shortest or one of the shortest.

12. The semiconductor structure of claim 11, wherein the plurality of first dummy fin structures and the plurality of second dummy fin structures are formed from spacer patterns on sidewalls of mandrel patterns in a double patterning process.

13. The semiconductor structure of claim 11, wherein the plurality of first dummy fin structures include pairs of first dummy fin structures, wherein each pair of first dummy fin structures have about equal length, and every pair of first dummy fin structures is shorter in length than an adjacent pair of first dummy fin structures that are further away from the respective short side of the second seal ring.

14. The semiconductor structure of claim 13, wherein the plurality of second dummy fin structures include pairs of second dummy fin structures, wherein each pair of second dummy fin structures have about equal length, and every pair of second dummy fin structures is shorter in length than an adjacent pair of second dummy fin structures that are further away from the respective short side of the second seal ring.

15. The semiconductor structure of claim 11, wherein the plurality of first dummy fin structures and the plurality of second dummy fin structures include a semiconductor material.

16. The semiconductor structure of claim 11, wherein each of the plurality of first dummy fin structures and the plurality of second dummy fin structures is at a bottom of a vertical structure that extends from a semiconductor substrate to a top metal layer covered by a passivation layer.

17. A semiconductor structure, comprising:
two circuit regions;
two circuit isolation structures surrounding the two circuit regions, respectively;
two first seal rings, each of the two first seal rings surrounding a respective one of the two circuit isolation structures; and
a second seal ring enclosing the two first seal rings, the second seal ring having a substantially rectangular periphery with two short sides and two long sides,
wherein the second seal ring includes multiple pairs of first dummy fin structures located between each of the two first seal rings and a respective short side of the second seal ring and multiple pairs of second dummy fin structures located between each of the two first seal rings and a respective long side of the second seal ring,
wherein each of the first dummy fin structures and each of the second dummy fin structures are parallel with the short sides of the second seal ring,
wherein each pair of first dummy fin structures have about equal length, and every pair of first dummy fin structures is shorter in length than an adjacent pair of first dummy fin structures that are further away from the respective short side of the second seal ring, and
wherein each pair of second dummy fin structures have about equal length, and every pair of second dummy fin structures is shorter in length than an adjacent pair of second dummy fin structures that are further away from the respective short side of the second seal ring.

18. The semiconductor structure of claim 17, wherein the second seal ring further includes:
third dummy fin structures located between each of the two first seal rings and the respective long side of the second seal ring, wherein the third dummy fin structures are lengthwise parallel to the second fin structure, have about equal length among the third dummy fin structures, and are substantially evenly distributed along the respective long side of the second seal ring.

19. The semiconductor structure of claim 17, wherein the first dummy fin structures and the second dummy fin structures are formed by etching a semiconductor substrate using spacer patterns formed on sidewalls of mandrel patterns in a double patterning process.

20. The semiconductor structure of claim 17, wherein the multiple pairs of first dummy fin structures are substantially evenly distributed in a space that is about 5 µm to 8 µm wide.

* * * * *